(12) United States Patent
Wang et al.

(10) Patent No.: US 11,776,905 B2
(45) Date of Patent: Oct. 3, 2023

(54) PACKAGE STRUCTURE, PACKAGE-ON-PACKAGE STRUCTURE AND MANUFACTURING METHOD THEREOF

(71) Applicant: Taiwan Semiconductor Manufacturing Company, Ltd., Hsinchu (TW)

(72) Inventors: Chuei-Tang Wang, Taichung (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/884,548

(22) Filed: Aug. 9, 2022

(65) Prior Publication Data

US 2022/0384337 A1    Dec. 1, 2022

Related U.S. Application Data

(60) Continuation of application No. 17/321,525, filed on May 17, 2021, now Pat. No. 11,456,249, which is a
(Continued)

(51) Int. Cl.
*H01L 23/48*    (2006.01)
*H01L 23/52*    (2006.01)
(Continued)

(52) U.S. Cl.
CPC ........ *H01L 23/5226* (2013.01); *H01L 21/486* (2013.01); *H01L 21/4857* (2013.01); *H01L 21/56* (2013.01); *H01L 23/3121* (2013.01); *H01L 23/49822* (2013.01); *H01L 24/09* (2013.01); *H01L 24/17* (2013.01);
(Continued)

(58) Field of Classification Search
CPC ............. H01L 23/5226; H01L 21/4857; H01L 21/486; H01L 21/56; H01L 23/3121; H01L 23/49822; H01L 24/09; H01L 24/17; H01L 2224/02372; H01L 2924/15311;
(Continued)

(56) References Cited

U.S. PATENT DOCUMENTS 9,000,584 B2    4/2015    Lin et al.
9,048,222 B2    6/2015    Hung et al.
(Continued)

*Primary Examiner* — Didarul A Mazumder
(74) *Attorney, Agent, or Firm* — JCIPRNET

(57) ABSTRACT

A package structure including an interposer, a semiconductor die, through insulator vias, an insulating encapsulant and a redistribution layer is provided. The interposer includes a core structure having a first and second surface, first metal layers disposed on the first and second surface, second metal layers disposed on the second surface over the first metal layers, and third metal layers disposed on the second surface over the second metal layers. The semiconductor die is disposed on the interposer. The through insulator vias are disposed on the interposer and electrically connected to the plurality of first metal layers. The insulating encapsulant is disposed on the interposer over the first surface and encapsulating the semiconductor die and the plurality of through insulator vias. The redistribution layer is disposed on the insulating encapsulant and electrically connected to the semiconductor die and the plurality of through insulator vias.

20 Claims, 11 Drawing Sheets

Related U.S. Application Data division of application No. 16/858,749, filed on Apr. 27, 2020, now Pat. No. 11,011,460, which is a continuation of application No. 16/016,664, filed on Jun. 25, 2018, now Pat. No. 10,643,943.

(51) Int. Cl.
*H01L 21/48* (2006.01)
*H01L 23/522* (2006.01)
*H01L 23/00* (2006.01)
*H01L 23/31* (2006.01)
*H01L 21/56* (2006.01)
*H01L 23/498* (2006.01)

(52) U.S. Cl.
CPC ............... *H01L 2224/02372* (2013.01); *H01L 2924/15311* (2013.01)

(58) Field of Classification Search
CPC ..... H01L 24/97; H01L 24/19; H01L 23/5389; H01L 23/49816
USPC ........................................................ 257/698
See application file for complete search history.

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 10,643,943 B2 * | 5/2020 | Wang | H01L 21/6835 |
| 2001/0038145 A1 * | 11/2001 | Mashino | H05K 1/162 |
| | | | 257/707 |
| 2003/0058630 A1 * | 3/2003 | Takano | H05K 1/0206 |
| | | | 257/E23.101 |
| 2004/0107569 A1 * | 6/2004 | Guzek | H01L 23/142 |
| | | | 257/782 |
| 2005/0284655 A1 * | 12/2005 | Hsu | H05K 3/4602 |
| | | | 174/258 |
| 2006/0243482 A1 * | 11/2006 | Chou | H05K 3/4602 |
| | | | 174/262 |
| 2007/0261234 A1 * | 11/2007 | Song | H05K 3/381 |
| | | | 29/829 |
| 2010/0006330 A1 * | 1/2010 | Fu | H01L 24/19 |
| | | | 29/856 |
| 2012/0119377 A1 * | 5/2012 | Muramatsu | H01L 23/49822 |
| | | | 257/E21.585 |
| 2013/0270682 A1 * | 10/2013 | Hu | H01L 25/50 |
| | | | 257/E21.705 |
| 2014/0124944 A1 * | 5/2014 | Zhang | H01L 23/49827 |
| | | | 257/774 |
| 2014/0239508 A1 * | 8/2014 | Ichikawa | H01L 24/06 |
| | | | 257/774 |
| 2015/0206863 A1 * | 7/2015 | Graf | H01L 24/83 |
| | | | 257/738 |

* cited by examiner

PACKAGE STRUCTURE, PACKAGE-ON-PACKAGE STRUCTURE AND MANUFACTURING METHOD THEREOF

CROSS-REFERENCE TO RELATED APPLICATION

This application is a continuation of U.S. application Ser. No. 17/321,525, filed on May 17, 2021, now allowed. The prior U.S. application Ser. No. 17/321,525 is a divisional application of and claims the priority benefit of U.S. application Ser. No. 16/858,749, filed on Apr. 27, 2020, now patented as U.S. Pat. No. 11,011,460, issued on May 18, 2021. The prior U.S. application Ser. No. 16/858,749 is a continuation application of and claims the priority benefit of U.S. application Ser. No. 16/016,664, filed on Jun. 25, 2018, now patented as U.S. Pat. No. 10,643,943, issued on May 5, 2020. The entirety of each of the above-mentioned patent applications is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
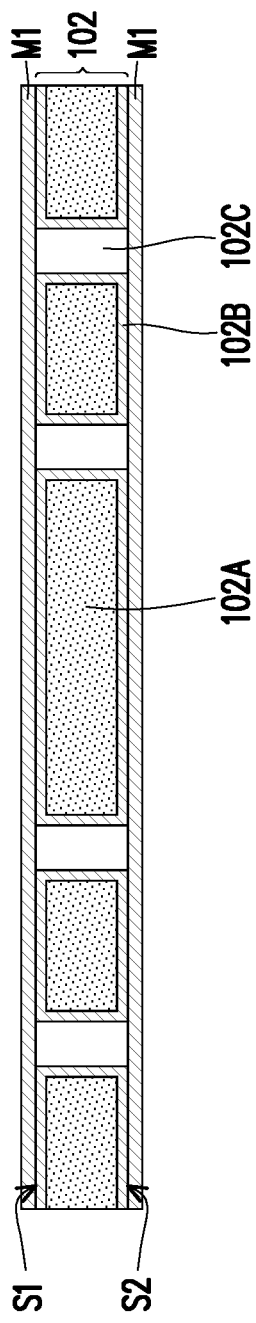
FIG. 1A to FIG. 1E are schematic cross-sectional views of various stages in a manufacturing method of an interposer according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views of various stages in a manufacturing method of an interposer according to some exemplary embodiments of the present disclosure. Referring to FIG. 1A, in some embodiments, a core structure 102 is provided. The core structure 102 may for example, includes a core substrate 102A, conductive layers 102B and an insulating material 102C. In some embodiments, a plurality of through holes (not shown) is formed in the core substrate 102A, and the conductive layer 102B fills into the through holes to surround the core substrate 102A. In certain embodiments, the through holes in the core substrate 102A are filled up by the insulating material 102C. In some embodiments, a material of the core substrate 102A is glass fiber and a material of the conductive layer 102B is copper, however, the disclosure is not limited thereto, and other material combinations are possible. In certain embodiments, a material of the insulating layer 102C includes solder mask material, via plugging material, epoxy, or the like.

As shown in FIG. 1A, the core structure 102 has a first surface S1, and a second surface S2 opposite to the first surface S1. After providing the core structure 102, a first metal material M1 is formed on the first surface S1 and the second surface S2 of the core structure 102. For example, the first metal material M1 covers the core substrate 102A, the conductive layer 102B and the insulating material 102C. In some embodiments, the conductive layer 102B electrically connects the first metal material M1 located on the first surface S1 of the core structure 102 to the first metal material M1 located on the second surface S2 of the core structure 102. In one embodiment, the insulating layer 102C is a via plugging material, and the via plugging material is sandwiched in between the first metal material M1 located on the first surface S1 of the core structure 102 and the first metal materials M1 located on the second surface S2 of the core structure 102. In some embodiments, the first metal material M1 is formed on the core structure 102 by electroplating or deposition. In certain embodiments, a seed layer (not shown) is formed on the first surface S1 and the second surface S2 of the core structure 102 prior to forming the first metal material M1. In other words, the seed layer is located in between the core structure 102 and the first metal material M1. In some embodiments, the first metal material M1 is copper.

Figure 1B:
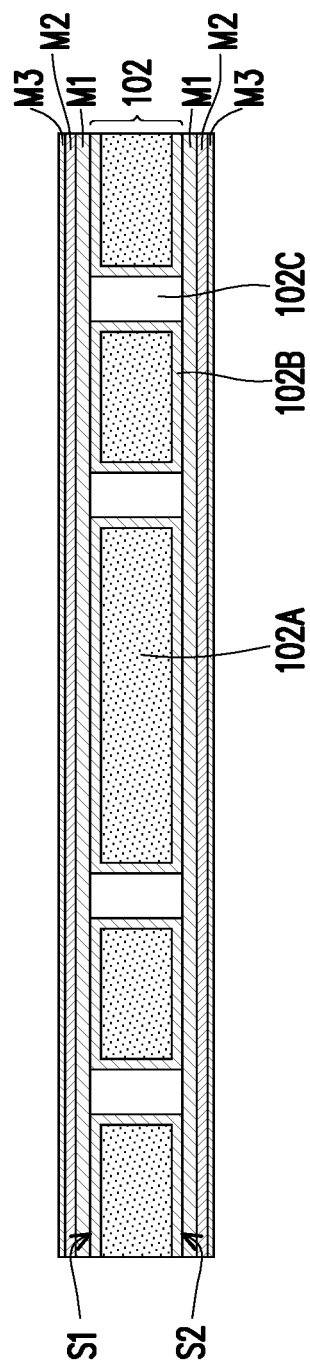

Referring to FIG. 1B, after forming the first metal material M1, a second metal material M2 and a third metal material M3 are sequentially formed. For example, the second metal material M2 is formed on the first surface S1 and the second surface S2 of the core structure 102 over the first metal material M1. Furthermore, the third metal material M3 is formed on the first surface S1 and the second surface S2 of the core structure 102 over the second metal material M2. In other words, the second metal material M2 covers the first metal material M1, while the third metal material M3 covers the second metal material M2. In some embodiments, the second metal material M2 and the third metal material M3 is formed on the core structure 102 by electroplating or deposition. In some embodiments, the second metal material M2 is different from the first metal material M1, and the third metal material M3 is different from the first metal material M1 and the second metal material M2. In certain embodiments, the second metal material M2 is nickel (Ni), while the third metal material M3 is gold (Au). In some embodiments, the layer of nickel is formed prior to forming the layer of gold, since the nickel layer may be used as a seed layer for forming the gold layer in a subsequent step.

Figure 1C:
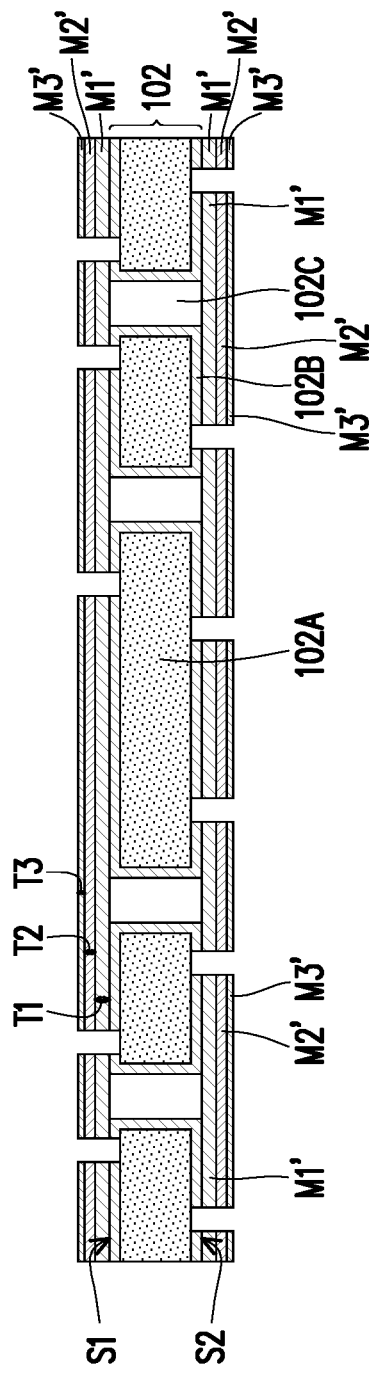

Referring to FIG. 1C, in a next step, the first metal material M1, the second metal material M2 and the third metal material M3 is patterned to form a plurality of first metal layers M1', a plurality of second metal layers M2' and a plurality of third metal layers M3'. In some embodiments, there are a plurality of first metal layers M1', a plurality of second metal layers M2' and a plurality of third metal layers M3 formed on the first surface S1 and the second surface S2 of the core structure 102. As illustrated in FIG. 1C, the plurality of first metal layers M1' is formed with a thickness T1, the plurality of second metal layers M2' is formed with a thickness T2, the plurality of third metal layers M3' is formed with a thickness T3, wherein T1>T2>T3. In certain embodiments, the thickness T1 is in a range of 10 μm to 50 μm, the thickness T2 is in a range of 1 μm to 5 μm, the thickness T3 is in a range of 0.05 μm to 1 μm. In one exemplary embodiment, the first metal layer M1' is copper, the second metal layer M2' is nickel, the third metal layer M3' is gold, wherein the copper layer is the thickest layer and the gold layer is the thinnest layer.

Figure 1D:
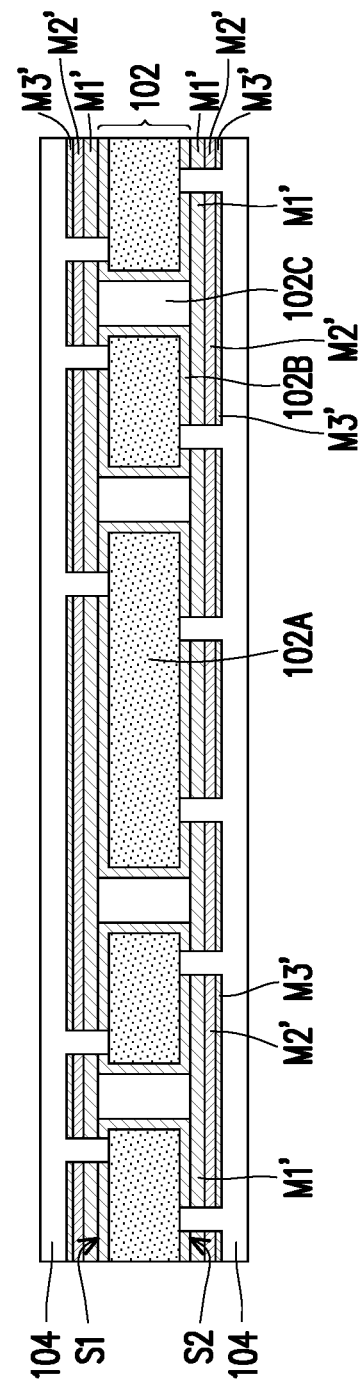

Referring to FIG. 1D, after forming the plurality of first metal layers M1', the plurality of second metal layers M2' and the plurality of third metal layers M3', an insulating layer 104 is formed. In some embodiments, the insulating layer 104 is formed to cover the core structure 102, and formed to cover the plurality of first metal layers M1', the plurality of second metal layers M2' and the plurality of third metal layers M3' disposed on the first surface S1 and the second surface S2 of the core structure 102. For example, the insulating layer 104 may fill in the spaces in between the first metal layers M1', fill in the spaces in between the second metal layers M2', and fill in the spaces in between the third metal layers M3'. In certain embodiments, a material of the insulating layer 104 includes solder mask material, via plugging material, epoxy, or the like.

Figure 1E:
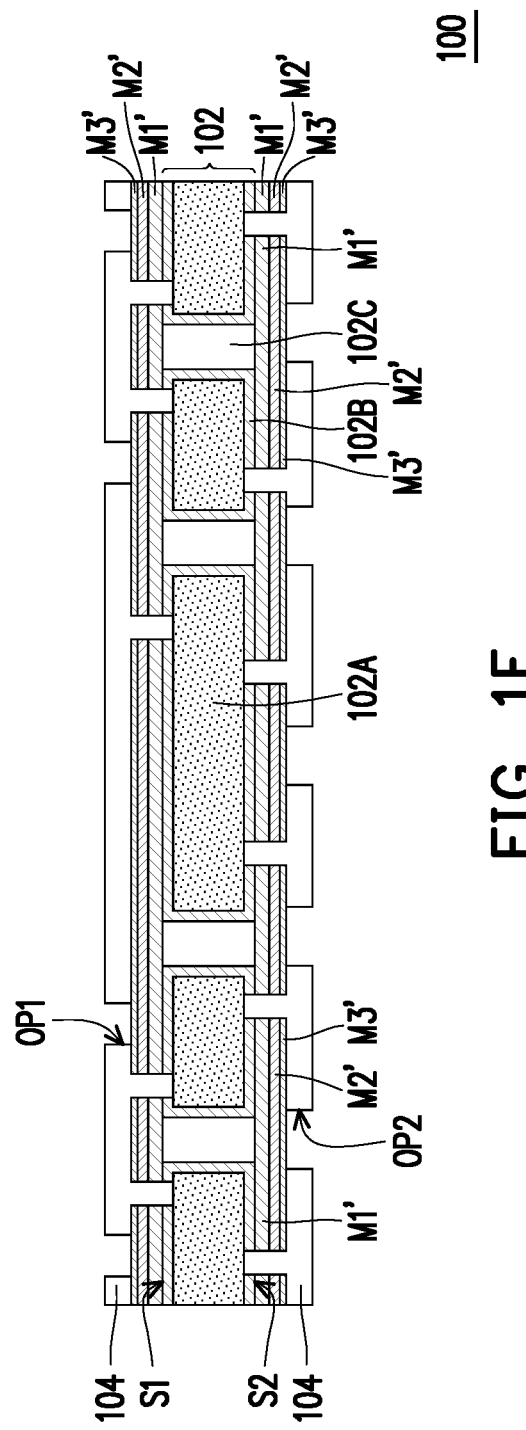

Referring to FIG. 1E, after forming the insulating layer 104, the insulating layer 104 is patterned to define a plurality of first openings OP1 and a plurality of second openings OP2. For example, the insulating layer 104 is patterned to form first openings OP1 that expose portions of the third metal layers M3' disposed on the first surface S1 of the core structure 102. Furthermore, the insulating layer 104 is patterned to form second openings OP2 that expose portions of the third metal layers M3' disposed on the second surface S2 of the core structure 102. Up till here, an interposer 100 (interconnection structure) according to some exemplary embodiments of the present disclosure is accomplished. The interposer 100 may be an organic interposer, and used to provide electrical connection to other components through the metal layers (M1', M2' and M3') located on the first surface S1 and the second surface S2 of the core structure 102.

Figure 2A:
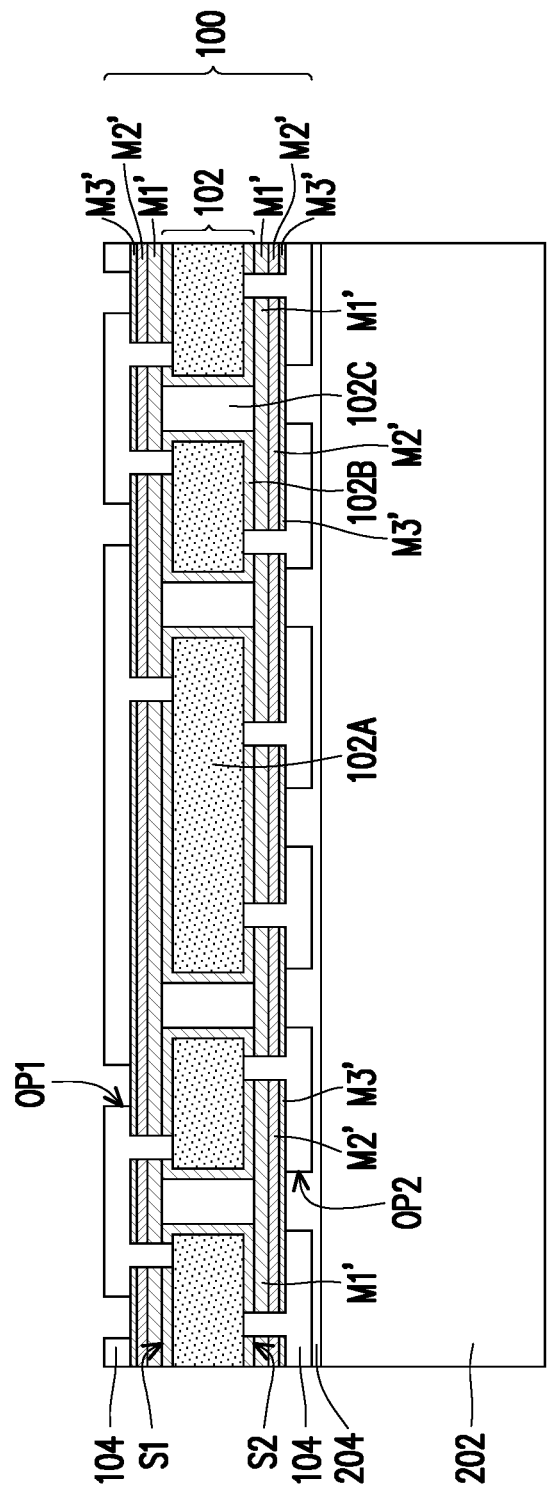
FIG. 2A to FIG. 2F are schematic cross-sectional views of various stages in a manufacturing method of a package structure according to some exemplary embodiments of the present disclosure.

FIG. 2A to FIG. 2F are schematic cross-sectional views of various stages in a manufacturing method of a package structure according to some exemplary embodiments of the present disclosure. Referring to FIG. 2A, a carrier 202 having a de-bonding layer 204 formed thereon is provided. In some embodiments, the carrier 202 may be a glass carrier or any suitable carrier for carrying a semiconductor wafer or a reconstituted wafer for the manufacturing method of the semiconductor package structure. In some embodiments, the de-bonding layer 204 may be any material suitable for bonding and de-bonding the carrier 202 from the above layer(s) or any wafer(s) disposed thereon.

In some embodiments, the de-bonding layer 204 may include a dielectric material layer made of a dielectric material including any suitable polymer-based dielectric material (such as benzocyclobutene ("BCB"), polybenzoxazole ("PBO")). In an alternative embodiment, the de-bonding layer 204 may include a dielectric material layer made of an epoxy-based thermal-release material, which loses its adhesive property when heated, such as a light-to-heat-conversion (LTHC) release coating film. In a further alternative embodiment, the de-bonding layer 204 may include a dielectric material layer made of an ultra-violet (UV) glue, which loses its adhesive property when exposed to UV lights. In certain embodiments, the de-bonding layer 204 may be dispensed as a liquid and cured, or may be a laminate film laminated onto the carrier 202. In certain embodiments, the de-bonding layer 204 is, for example, a LTHC layer with good chemical resistance, and such layer enables room temperature de-bonding from the carrier 202 by applying laser irradiation.

After providing the carrier 202 and the de-bonding layer 204, the interposer 100 manufactured in the steps shown in FIG. 1A to FIG. 1E is laminated onto the carrier 202 over the de-bonding layer 204. For example, the second openings OP2 of the insulating layer 104 is covered up by the de-bonding layer 204. In other words, the interposer 100 is disposed on the carrier 202 in a way that the first metal layers M1', the second metal layers M2' and the third metal layers M3' located on the first surface S1 of the core structure 102 faces away from the carrier 202.

Figure 2B:
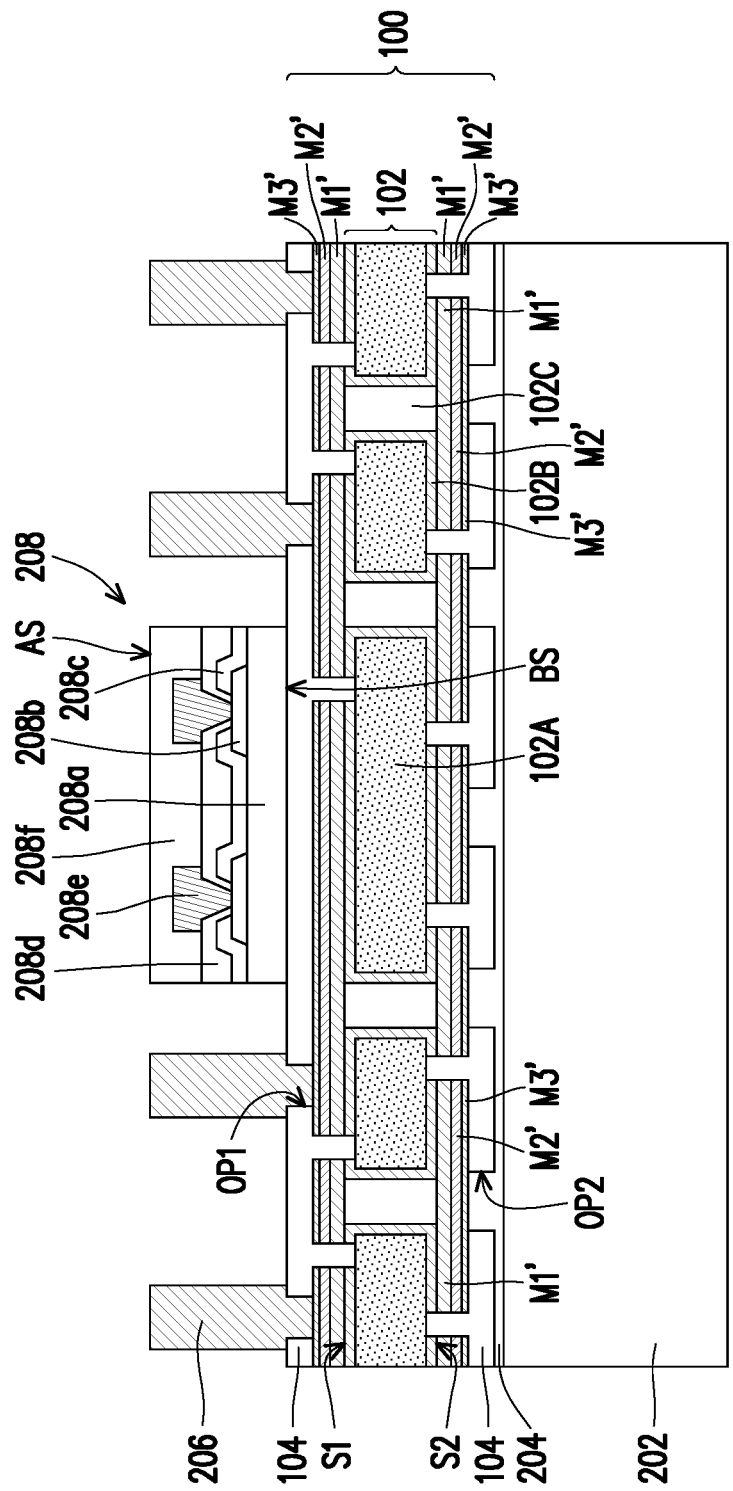

Referring to FIG. 2B, after laminating the interposer 100 onto the carrier 202, a plurality of through insulator vias 206 is formed on the interposer 100 and over the carrier 202, and at least one semiconductor die 208 is provided on the interposer. In some embodiments, the through insulator vias 206 are through integrated fan-out ("InFO") vias. In some embodiments, the though insulator vias 206 fills into the first openings OP1 of the insulating layer 104, and the though insulator vias 206 is physically connected to the third metal layers M3' disposed on the first surface S1 of the core structure 102. In certain embodiments, the though insulator vias 206 are electrically connected to the first metal layers M1' and the second metal layers M2' disposed on the first surface S1 of the core structure 102 through the third metal layers M3'. In one embodiment, the formation of the through insulator vias 206 includes forming a mask pattern (not shown) with openings, then forming a metallic material (not shown) filling up the openings by electroplating or deposition, and removing the mask pattern to form the through insulator vias 206 on the interposer 100. The material of the mask pattern may include a positive photo-resist or a negative photo-resist. In one embodiment, the material of the through insulator vias 206 may include a metal material such as copper or copper alloys, or the like. However, the disclosure is not limited thereto.

In an alternative embodiment, the through insulator vias 206 may be formed by forming a seed layer (not shown) on the interposer 100; forming the mask pattern with openings exposing portions of the seed layer; forming the metallic material on the exposed portions of the seed layer to form the through insulator vias 206 by plating; removing the mask pattern; and then removing portions of the seed layer exposed by the through insulator vias 206 For example, the seed layer may be a titanium/copper composited layer. For simplification, only four through insulator vias 206 are illustrated in FIG. 2B. However, it should be noted that the number of through insulator vias 206 is not limited thereto, and can be selected based on requirement.

Furthermore, as illustrated in FIG. 2B, at least one semiconductor die 208 is picked and placed on the interposer 100. In certain embodiments, the semiconductor die 208 has an active surface AS, and a backside surface BS opposite to the active surface AS. For example, the backside surface BS of the semiconductor die 208 may be attached to the interposer 100 through a die attach film (not shown). By using the die attach film, a better adhesion between the semiconductor die 208 and the interposer 100 is ensured. In the exemplary embodiment, only one semiconductor die 208 is illustrated, however, the disclosure is not limited thereto. In other embodiments, the number of semiconductor die disposed on the interposer 100 may be adjusted based on product requirement.

In the exemplary embodiment, the semiconductor die 208 includes a semiconductor substrate 208a, a plurality of conductive pads 208b, a passivation layer 208c, a post passivation layer 208d, a plurality of conductive posts or conductive vias 208e, and a protection layer 208f. As illustrated in FIG. 2B, the plurality of conductive pads 208b is disposed on the semiconductor substrate 208a. The passivation layer 208c is formed over the semiconductor substrate 208a and has openings that partially expose the conductive pads 208b on the semiconductor substrate 208a. The semiconductor substrate 208a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 208b may be aluminum pads, copper pads or other suitable metal pads. The passivation layer 208c may be a silicon oxide layer, a silicon nitride layer, a silicon oxynitride layer or a dielectric layer formed of any suitable dielectric materials. Furthermore, in some embodiments, the post-passivation layer 208d is optionally formed over the passivation layer 208c. The post-passivation layer 208d covers the passivation layer 208c and has a plurality of contact openings. The conductive pads 208b are partially exposed by the contact openings of the post passivation layer 208d. The post-passivation layer 208d may be a benzocyclobutene (BCB) layer, a polyimide layer, a polybenzoxazole (PBO) layer, or a dielectric layer formed by other suitable polymers. In some embodiments, the conductive posts or conductive vias 208e are formed on the conductive pads 208b by plating. In some embodiments, the protection layer 208f is formed on the post passivation layer 208d covering the conductive posts or conductive vias 208e so as to protect the conductive posts or conductive vias 208e.

In some embodiments, when more than one semiconductor die 208 is present, the semiconductor dies 208 placed on the interposer 100 may be arranged in an array. Furthermore, when the semiconductor dies 208 are arranged in an array, the through insulator vias 206 may be classified into groups. The number of the semiconductor dies 208 may correspond to the number of the groups of the through insulator vias 206. In the illustrated embodiment, the semiconductor die 208 may be picked and placed on the interposer 100 after the formation of the through insulator vias 206. However, the disclosure is not limited thereto. In some alternative embodiments, the semiconductor die 208 may be picked and placed on the interposer 100 before the formation of the through insulator vias 206.

Figure 2C:
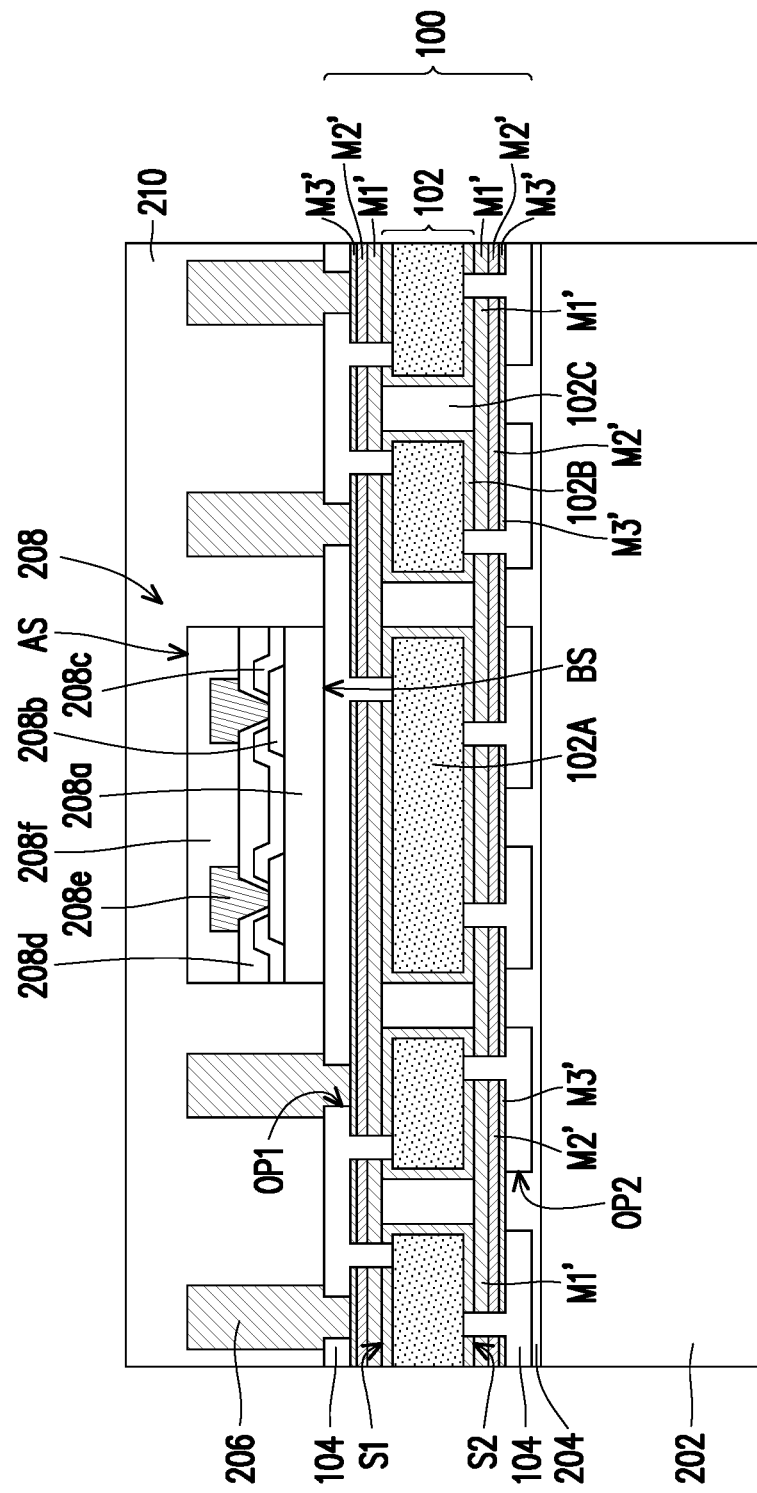

Referring to FIG. 2C, after forming the through insulator vias 206 and providing the semiconductor die 208, an insulating material 210 is formed on the interposer 100 and over the semiconductor die 208. In some embodiments, the insulating material 210 is formed through, for example, a compression molding process, filling up the gaps between the semiconductor die 208 and adjacent through insulator vias 206 to encapsulate the semiconductor die 208. The insulating material 210 also fills up the gaps between the through insulator vias 206 to encapsulate the through insulator vias 206. The conductive posts or conductive vias 208e and the protection layer 208f of the semiconductor die 208 are encapsulated by and well protected by the insulating material 210. In other words, the conductive posts or conductive vias 208e and the protection layer 208f of the semiconductor die 208 are not revealed and are well protected by the insulating material 210.

In some embodiments, the insulating material 210 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 210 may include an acceptable insulating encapsulation material. In some embodiments, the insulating material 210 may further include inorganic filler or inorganic compound (e.g. silica, clay, and so on) which can be added therein to optimize coefficient of thermal expansion (CTE) of the insulating material 210. The disclosure is not limited thereto.

Figure 2D:
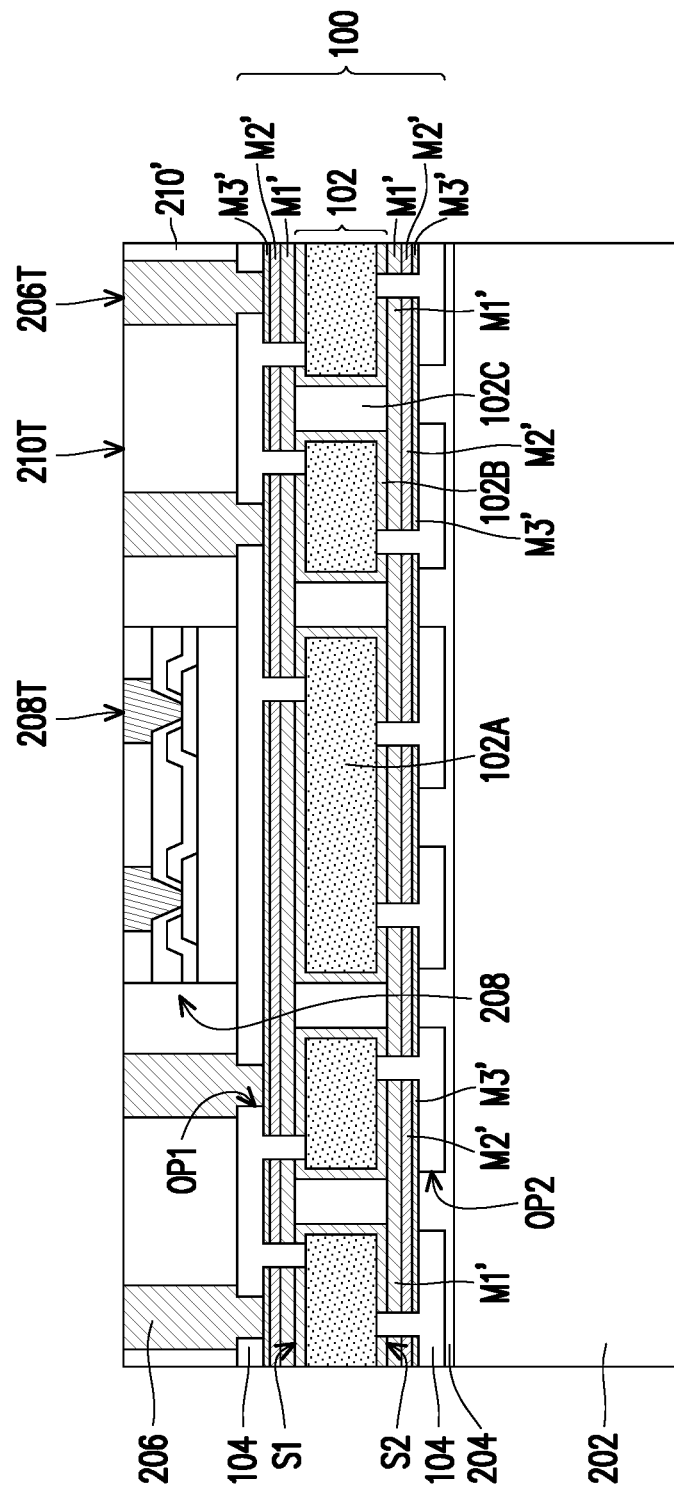

Referring to FIG. 2D, in some embodiments, the insulating material 210 is planarized to from an insulating encapsulant 210' exposing the through insulator vias 206 and the semiconductor die 208. In some embodiments, the insulating material 210 and the protection layer 208f are ground or polished by a planarization step. For example, the planarization step is performed through a mechanical grinding process and/or a chemical mechanical polishing (CMP) process until the top surfaces 208T (or active surface AS) of the conductive posts 208e are revealed. In some embodiments, the through insulator vias 206 may be partially polished so that the top surfaces 206T of the through insulator vias 206 are levelled with the top surfaces 208T of the conductive posts 208e, or levelled with the active surface AS of the semiconductor die 208. In other words, the conductive posts 208e and the through insulator vias 208 may also be slightly grinded/polished.

In the illustrated embodiment, after polishing the insulating material 210 to form the insulating encapsulant 210', the top surface 210T of the insulating encapsulant 210', the top surface 206T of the through insulator vias 206, the top surface 208T of the conductive posts 208e, and the top surface of the polished protection layer 208f are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 2E:
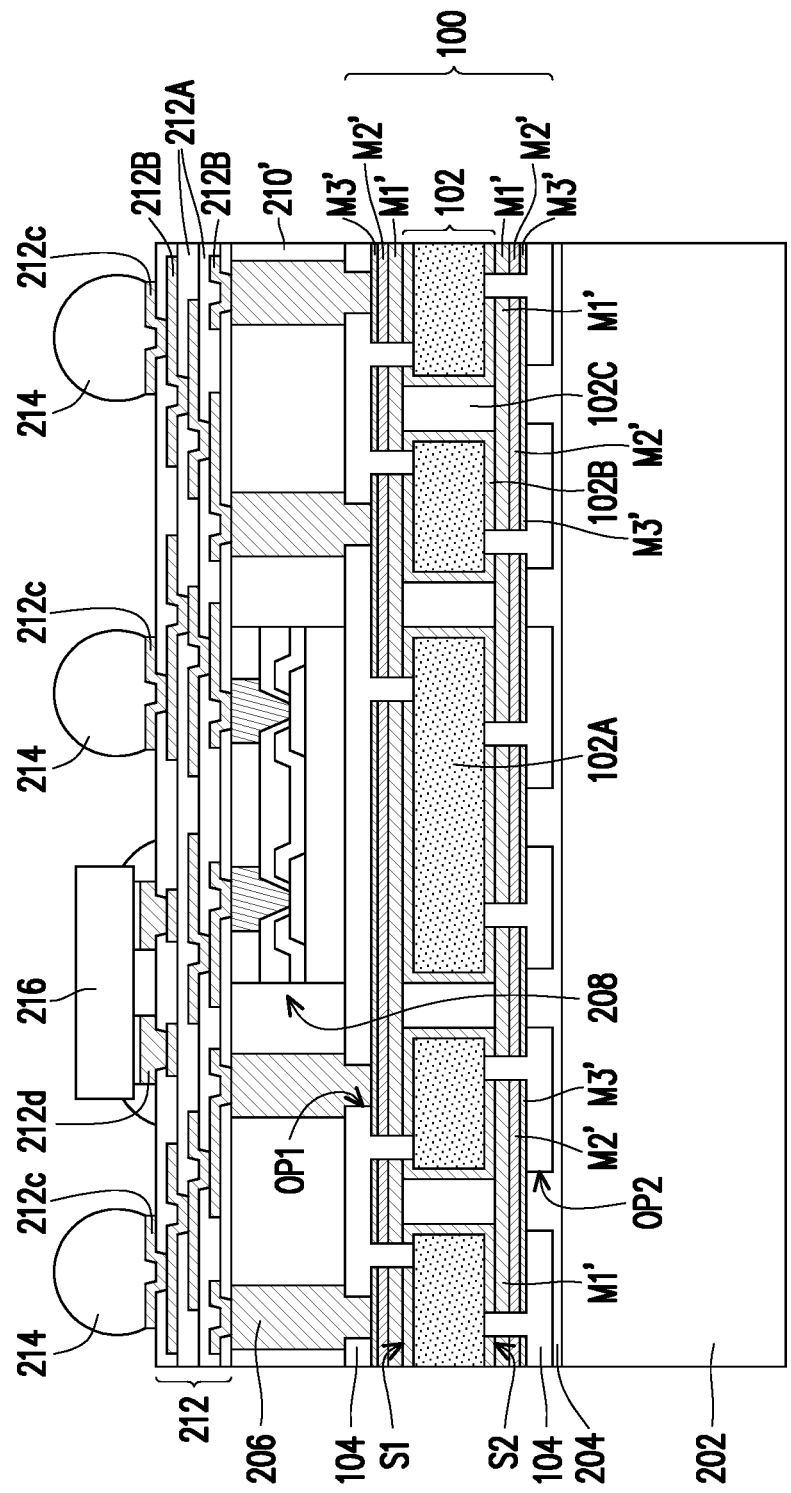

Referring to FIG. 2E, after the planarization step, a redistribution layer 212 is formed on the insulating encapsulant 210', the through insulator vias 206 and the semiconductor die 208. As shown in FIG. 2E, the redistribution layer 212 is formed on the top surface 206T of the through insulator vias 208, on the top surfaces 208T of the conductive posts 208e, and on the top surface 210T of the insulating encapsulant 210'. In some embodiments, the redistribution layer 212 is electrically connected to the through insulator vias 206, and is electrically connected to the semiconductor die 208 through the conductive posts 208e. In some embodiments, the semiconductor die 208 are electrically connected to the through insulator vias 206 through the redistribution layer 212.

In some embodiments, the formation of the redistribution layer 212 includes sequentially forming one or more dielectric layers 212A, and one or more metallization layers 212B in alternation. In certain embodiments, the metallization layers 212B are sandwiched between the dielectric layers 212A. Although only three layers of the metallization layers 212B and four layers of dielectric layers 212A are illustrated herein, however, the scope of the disclose is not limited by the embodiments of the disclosure. In other embodiments, the number of metallization layers 212B and the dielectric layers 212A may be adjusted based on product requirement. In some embodiments, the metallization layers 212B are electrically connected to the conductive posts 208e of the semiconductor die 208. Furthermore, the metallization layers 212B are electrically connected to the through insulator vias 206.

In certain embodiments, the material of the dielectric layers 212A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 212A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 212B may be made of conductive materials formed by electroplating or deposition, such as aluminum, titanium, copper, nickel, tungsten, and/or alloys thereof, which may be patterned using a photolithography and etching process. In some embodiments, the metallization layer 212B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 212, a plurality of conductive pads 212c, 212d may be disposed on an exposed top surface of the topmost layer of the metallization layers 212B for electrically connecting with conductive balls. In certain embodiments, the conductive pads 212c are for example, under-ball metallurgy (UBM) patterns used for ball mount. In some embodiments, the conductive pads 212d are connection pads for mounting at least one passive component. As shown in FIG. 2E, the conductive pads 212c, 212d are formed on and electrically connected to the redistribution layer 212. In some embodiments, the materials of the conductive pads 212cm 212d may include copper, nickel, titanium, tungsten, or alloys thereof or the like, and may be formed by an electroplating process, for example. The number of conductive pads 212c, 212d are not limited in this disclosure, and may be selected based on the design layout.

As illustrated in FIG. 2E, after forming the conductive pads 212c, 212d, a plurality of conductive balls 214 is disposed on the conductive pads 212c, and at least one passive component 216 is mounted on and electrically connected to the conductive pads 212d. In some embodiments, the conductive balls 214 may be disposed on the conductive pads 212c by a ball placement process or reflow process. In some embodiments, the conductive balls 214 are, for example, solder balls or ball grid array (BGA) balls. In some embodiments, the conductive balls 214 are connected to the redistribution layer 212 through the conductive pads 212c. In certain embodiments, the passive component 216 is connected to the conductive pads 212d through a soldering process or reflow process. In some embodiments, the passive component 216 may be an integrated passive device including resistors, capacitors, inductors, resonators, filters, and/or the like. In some embodiments, the passive component 216 is electrically connected to the redistribution layer 212 through the conductive pads 212d.

Figure 2F:
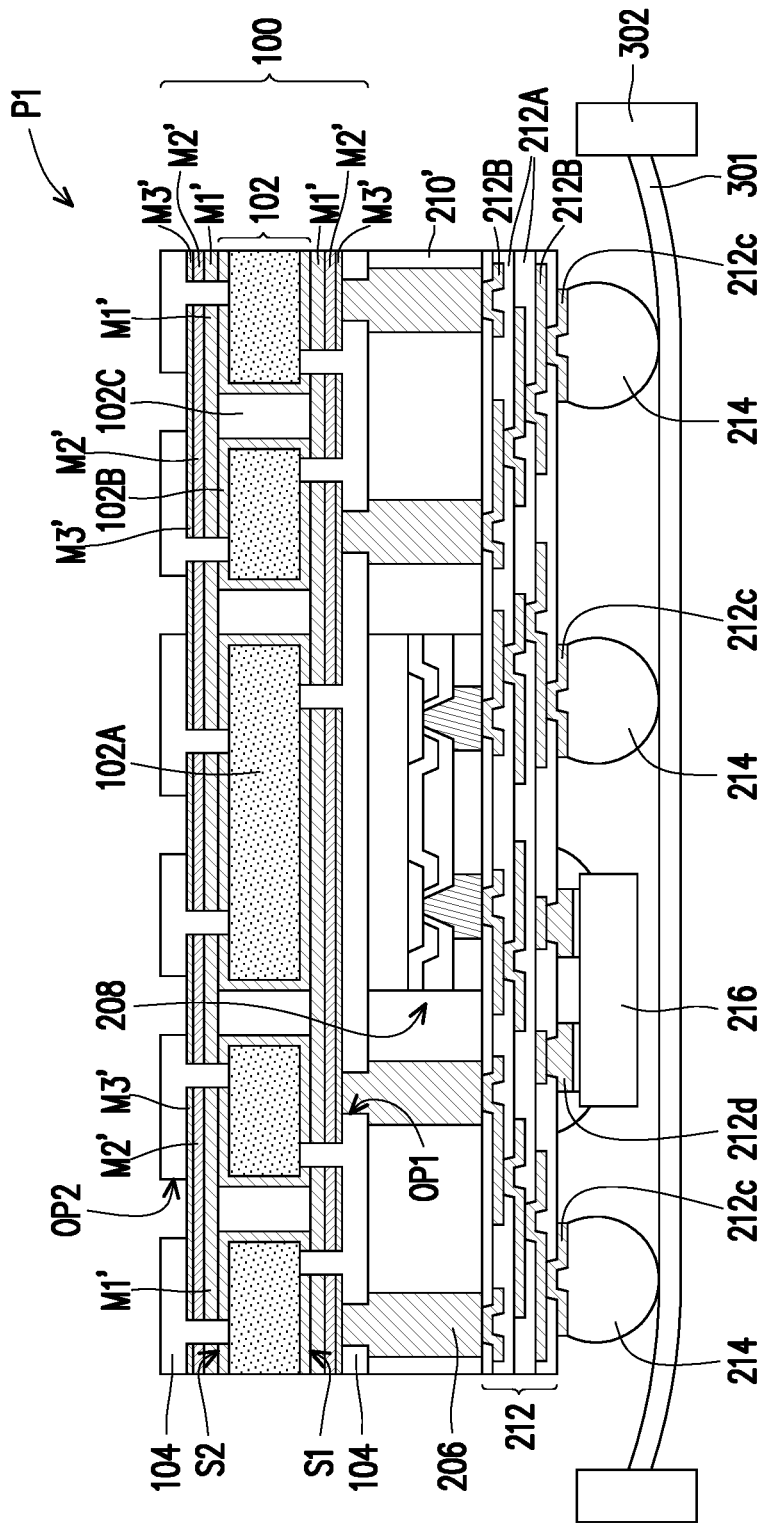

Referring to FIG. 2F, after forming the redistribution layer 212, and providing the conductive balls 214 and the passive component 216, the structure shown in FIG. 2E may be turned upside down and attached to a tape 301 supported by a frame 302. Subsequently, the carrier 202 may be de-bonded so as to separate the interposer 100 and other components from the carrier 202. In the exemplary embodiment, the de-bonding process includes projecting a light such as a laser light or an UV light on the de-bonding layer 204 (e.g., the LTHC release layer), such that the carrier 202 can be easily removed. In certain embodiments, the de-bonding layer 204 may be further removed or peeled off to reveal the second openings OP2 of the insulating layer 104. In other words, the carrier 202 and the de-bonding layer 204 are removed to expose the third metal layers M3' located on the second surface S2 of the core structure 102. In some embodiments, after de-bonding the carrier 202, a dicing process may be performed to cut the whole package structure into individual packages (first package P1).

Figure 2G:
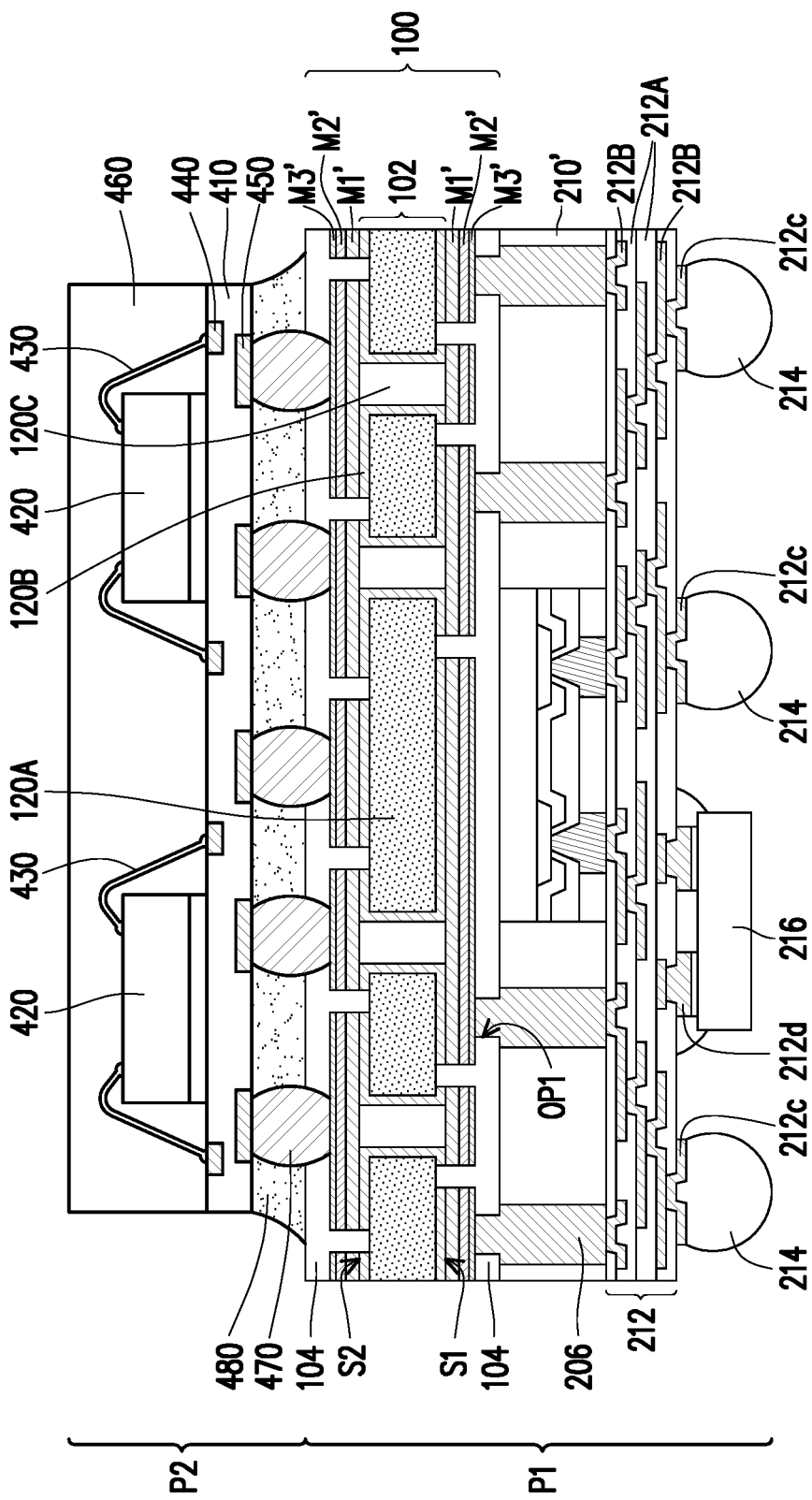
FIG. 2G is a schematic cross-sectional view of a package-on-package (PoP) structure according to some exemplary embodiments of the present disclosure.

FIG. 2G is a schematic cross-sectional view of a package-on-package (PoP) structure according to some exemplary embodiments of the present disclosure. After forming the first package P1 as shown in FIG. 2F, a second package P2 may be stacked on the first package P1 to form a package-on-package (PoP) structure. For example, the second package P2 is electrically connected to first package P1 through the plurality of third metal layers M3' disposed on the second surface S2 of the core structure 102.

In some embodiments, the second package P2 has a substrate 410, a plurality of semiconductor chips 420 mounted on one surface (e.g. top surface) of the substrate 410. In some embodiments, the semiconductor chips 420 are logic chips (e.g., central processing unit, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, signal processing chips (e.g., digital signal processing (DSP) chips), front-end chips (e.g., analog front-end (AFE) chips, the like, or a combination thereof. In one embodiment, both of the semiconductor chips 420 may, for example, be DRAM chips, but the disclosure is not limited thereto. In some embodiments, bonding wires 430 are used to provide electrical connections between the semiconductor chips 420 and pads 440 (such as bonding pads). In some embodiments, an insulating encapsulant 460 is formed to encapsulate the semiconductor chips 420 and the bonding wires 430 to protect these components. In some embodiments, through insulator vias (not shown) may be used to provide electrical connection between the pads 440 and conductive pads 450 (such as bonding pads) that are located on another surface (e.g. bottom surface) of the substrate 410. In certain embodiments, the conductive pads 450 are electrically connected to the semiconductor chips 420 through these through insulator vias (not shown). In some embodiments, the conductive pads 450 of the second package P2 are electrically connected to the third metal layers M3' of the first package P1 through the conductive balls 470 that are sandwiched therebetween. In certain embodiments, the conductive balls 470 are physically connected to the third metal layers M3' (on second surface S2 of cores structure 102) of the first package P1. In addition, an underfill structure 480 may fill up the gaps between the conductive balls 470 and encapsulate the conductive balls 470. After stacking the second package P2 on the first package P1 and providing electrical connection between the packages through the conductive balls 470, a package-on package structure can be fabricated.

Figure 3:
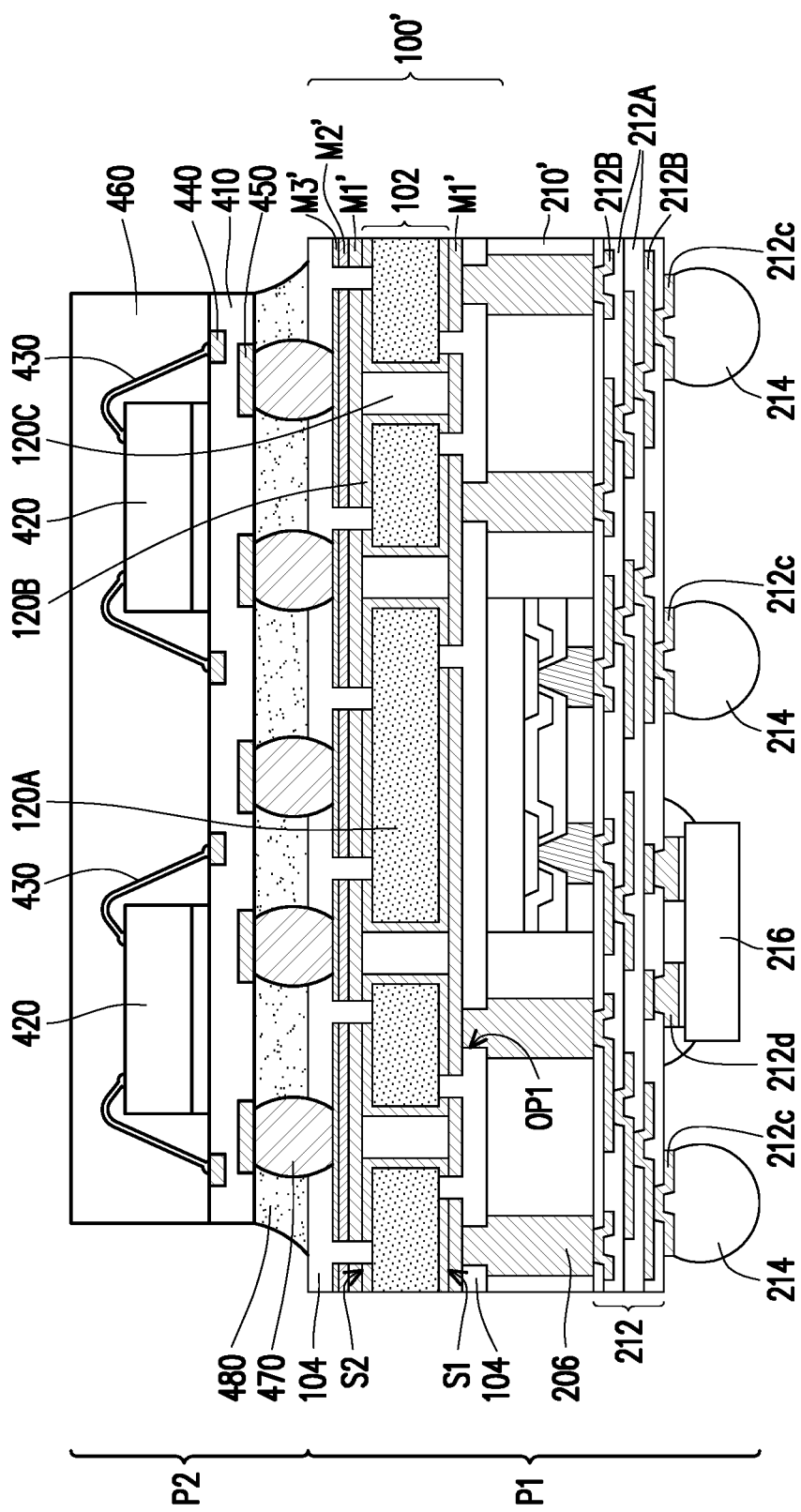
FIG. 3 is a schematic cross-sectional view of a package-on-package (PoP) structure according to some other exemplary embodiments of the present disclosure.

FIG. 3 is a schematic cross-sectional view of a package-on-package (PoP) structure according to some other exemplary embodiments of the present disclosure. The package-on-package structure shown in FIG. 3 is similar to the package-on-package structure shown in FIG. 2G, hence the same reference numerals are used to refer to the same or liked parts, and the description will not be repeated herein. The difference between the embodiment shown in FIG. 3 and the embodiment shown in FIG. 2G is in the design of the first package P1. As illustrated in FIG. 3, an interposer 100' is provided in the first package P1. The interposer 100' includes a core structure 102 having a first surface S1 and a second surface S2 opposite to the first surface S1. In some embodiments, a plurality of first metal layers M1' is disposed on the first surface S1 and the second surface S2 of the core structure 102. Furthermore, a plurality of second metal layers M2' and a plurality of third metal layers M3' are sequentially disposed on the second surface S2 of the core structure 102 over the first metal layers M1'. However, the second metal layers M2' and the third metal layers M3' are not located on the first surface S1 of the core structure 102. In other words, the through insulator vias 206 are physically connected to the first metal layers M1' located on the first surface S1 of the core structure 102.

In the above embodiments, a package structure having an interposer is provided. The interposer includes metal layers made of nickel (second metal layer), and metal layers made of gold (third metal layer) disposed on the nickel layer. These nickel and gold metal layers are at least located on a backside surface of the interposer to function as bonding pads for providing connection to another package structure. For example, the nickel and gold layers are electrically connected to the DRAM chips of another package structure. By manufacturing an interposer having the designated features, the production cost of the package may be reduced. Furthermore, by using the interposer for providing connection between packages, the design of conductive balls of the second package is more flexible. It empowers versatile types of second package to join with the first package, without limitation in the design of the second package.

In some embodiments of the present disclosure, a package structure including an interposer, a semiconductor die, a plurality of through insulator vias, an insulating encapsulant and a redistribution layer is provided. The interposer includes a core structure having a first surface and a second surface opposite to the first surface, a plurality of first metal layers disposed on the first surface and the second surface of the core structure, a plurality of second metal layers disposed on at least the second surface of the core structure over the plurality of first metal layers, and a plurality of third metal layers disposed on at least the second surface of the core structure over the plurality of second metal layers. The plurality of first metal layers, the plurality of the second metal layers and the plurality of third metal layers are made of different materials. The semiconductor die is disposed on the interposer over the first surface of the core structure. The plurality of through insulator vias is disposed on the interposer over the first surface of the core structure, and electrically connected to the plurality of first metal layers on the first surface of the core structure. The insulating encapsulant is disposed on the interposer over the first surface of the core structure and encapsulating the semiconductor die and the plurality of through insulator vias. The redistribution layer is disposed on the insulating encapsulant and electrically connected to the semiconductor die and the plurality of through insulator vias.

In another embodiment of the present disclosure a package-on-package structure is provided. The package-on-package structure includes a first package and a second package. The first package includes a semiconductor die, a plurality of through insulator vias, an insulating encapsulant, an interposer and a redistribution layer. The semiconductor die has an active surface and a backside surface opposite to the active surface. The through insulator vias are surrounding the semiconductor die. The insulating encapsulant is encapsulating the semiconductor die and the plurality of through insulator vias. The interposer is disposed on the backside surface of the semiconductor die, wherein the interposer includes a core structure having a first surface and a second surface opposite to the first surface, a plurality of first metal layers disposed on the first surface and the second surface of the core structure, a plurality of second metal layers disposed on the first surface and the second surface of the core structure over the plurality of first metal layers, and a plurality of third metal layers disposed on the first surface and the second surface of the core structure over the plurality of second metal layers, wherein the plurality of first metal layers, the plurality of the second metal layers and the plurality of third metal layers are made of different materials, and the plurality of through insulator vias is physically connected to the plurality of third metal layers disposed on the first surface of the core structure. The redistribution layer is disposed on the active surface of the semiconductor die, and electrically connected to the semiconductor die and the plurality of through insulator vias. The second package is stacked on the first package and electrically connected to the plurality of third metal layers disposed on the second surface of the core structure.

In yet another embodiment of the present disclosure, a method of forming a package structure is described. The method includes the following steps. An interposer is formed by the following steps. A core structure having a first surface and a second surface opposite to the first surface is provided. A first metal material is formed on the first surface and the second surface of the core structure. A second metal material is formed on the first surface and the second surface of the core structure over the first metal material, wherein the second metal material is different from the first metal material. The third metal material is formed on the first surface and the second surface of the core structure over the second metal material, wherein the third metal material is different from the first metal material and the second metal material. The first metal material, the second metal material and the third metal material are patterned to form a plurality of first metal layers, a plurality of second metal layers and a plurality of third metal layers. An insulating layer is formed to cover the core structure, the plurality of first metal layers, the plurality of second metal layers and the plurality of third metal layers. The insulating layer is patterned to form a plurality of first openings exposing portions of the third metal layers disposed on the first surface of the core structure and a plurality of second openings exposing portions of the third metal layers disposed on the second surface of the core structure. The interposer formed above is laminated on a carrier. A plurality of through insulator vias is formed on the interposer, wherein the plurality of through insulator vias is physically connected to the third metal layers on the first surface of the core structure. A semiconductor die is disposed on the interposer over the first surface of the core structure. An insulating encapsulant is formed to encapsulate the plurality of though insulator vias and the semiconductor die. A redistribution layer is formed on the insulating encapsulant, wherein the redistribution layer is electrically connected to the semiconductor die and the plurality of through insulator vias. The carrier is removed to expose the third metal layers on the second surface of the core structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a first package, which comprises:
        a core substrate having a first surface and a second surface opposite to the first surface;
        a die disposed on the first surface of the core substrate;
        a first set of stacked metal layers disposed on the second surface of the core substrate, wherein the first set of stacked metal layers comprises:
        first metal layer patterns;
        second metal layer patterns directly disposed on the first metal layer patterns;
        third metal layer patterns directly disposed on the second metal layer patterns, wherein sidewalls of the first metal layer patterns, sidewalls of the second metal layer patterns and sidewalls of the third metal layer patterns are aligned; and
    a second package comprising a plurality of semiconductor chips, wherein the second package is directly disposed on and electrically connected to the third metal layer patterns.

2. The structure according to claim 1, wherein the first metal layer patterns, the second metal layer patterns and the third metal layer patterns have the same pattern layouts.

3. The structure according to claim 1, wherein the first metal layer patterns has a thickness of T1, the second metal layer patterns has a thickness of T2, the third metal layer patterns has a thickness of T3, and wherein T1>T2>T3.

4. The structure according to claim 1, wherein the first metal layer patterns, the second metal layer patterns and the third metal layer patterns are made of different materials.

5. The structure according to claim 1, wherein the first package further comprises a conductive layer surrounding the core substrate and covering and contacting the first surface and the second surface of the core substrate, and the first metal layer patterns are directly disposed on the conductive layer over the second surface of the core substrate.

6. The structure according to claim 1, wherein the first package further comprises a second set of stacked metal layers disposed on the first surface of the core substrate, and the second set of stacked metal layers comprises:
    first metal layer patterns;
    second metal layer patterns directly disposed on the first metal layer patterns; and
    third metal layer patterns directly disposed on the second metal layer patterns, wherein sidewalls of the first metal layer patterns, sidewalls of the second metal layer patterns and sidewalls of the third metal layer patterns are aligned.

7. The structure according to claim 1, wherein the second package further comprises a plurality of conductive balls, and the plurality of conductive balls is disposed on and in physical contact with the third metal layer patterns of the first package.

8. The structure according to claim 1, further comprising a via plugging material penetrating through the core substrate, and contacting the first metal layer patterns of the first set of stacked metal layers.

9. A structure, comprising:
    a semiconductor die disposed on a first surface of an insulating layer;
    a plurality of through insulator vias disposed on the first surface of the insulating layer and surrounding the semiconductor die;
    a plurality of insulating material vias disposed on a second surface of the insulating layer, wherein the second surface is opposite to the first surface, and the plurality of insulating material vias is misaligned and non-overlapped with the plurality of through insulator vias;

a first metal layer disposed on a first side of the plurality of insulating material vias, and sandwiched between the plurality of insulating material vias and the insulating layer;

a plurality of stacked metal layers disposed on a second side of the plurality of insulating material vias; and a plurality of conductive balls disposed on and electrically connected to the plurality of stacked metal layers.

10. The structure according to claim 9, wherein the plurality of stacked metal layers comprises at least one metal material that is different from a material of the first metal layer.

11. The structure according to claim 10, wherein the plurality of stacked metal layers comprises a copper layer, a nickel layer disposed on the copper layer and a gold layer disposed on the nickel layer.

12. The structure according to claim 9, further comprising a second insulating layer covering the plurality of stacked metal layers and partially surrounding the plurality of conductive balls.

13. The structure according to claim 9, further comprising a substrate disposed on the plurality of conductive balls, and a plurality of semiconductor chips disposed on the substrate.

14. The structure according to claim 9, further comprising a conductive layer covering sidewalls of the plurality of insulating material vias, and located in between the first metal layer and the plurality of stacked metal layers.

15. The structure according to claim 14, wherein the plurality of conductive balls is electrically connected to the plurality of through insulator vias through the plurality of stacked metal layers, the conductive layer and the first metal layer.

16. A structure, comprising:
a plurality of semiconductor chips disposed on a first surface of a substrate;
an insulating encapsulant disposed on the first surface of the substrate and encapsulating the plurality of semiconductor chips;
a plurality of conductive balls disposed on a second surface of the substrate opposite to the first surface;
stacked metal layers disposed on and electrically connected to the plurality of conductive balls, wherein the stacked metal layers comprise at least two different metal materials; and
a redistribution layer disposed over the second surface of the substrate over the stacked metal layers, wherein the redistribution layer is electrically connected to the stacked metal layers by a plurality of through insulator vias.

17. The structure according to claim 16, further comprising a semiconductor die sandwiched between the stacked metal layers and the redistribution layer, wherein the semiconductor die is electrically connected to the redistribution layer.

18. The structure according to claim 16, wherein the stacked metal layers comprise at least two metal layers with different thicknesses.

19. The structure according to claim 16, further comprising a core substrate located in between the plurality of conductive balls and the redistribution layer, wherein the stacked metal layers are disposed on two opposing surfaces of the core substrate.

20. The structure according to claim 19, wherein sidewalls of the core substrate are aligned with sidewalls of the redistribution layer, and misaligned with sidewalls of the insulating encapsulant.

* * * * *